US011568938B2

(12) United States Patent
Gorobets et al.

(10) Patent No.: US 11,568,938 B2
(45) Date of Patent: Jan. 31, 2023

(54) QLC DATA PROGRAMMING

(71) Applicant: Western Digital Technologies, Inc., San Jose, CA (US)

(72) Inventors: Sergey Anatolievich Gorobets, Edinburgh (GB); Alan D. Bennett, Edinburgh (GB); Liam Parker, Edinburgh (GB); Yuval Shohet, Acton, MA (US); Michelle Martin, Westford, MA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/182,023

(22) Filed: Feb. 22, 2021

(65) Prior Publication Data

US 2022/0139466 A1  May 5, 2022

Related U.S. Application Data

(60) Provisional application No. 63/109,114, filed on Nov. 3, 2020.

(51) Int. Cl.
  *G11C 16/26*   (2006.01)
  *G11C 16/08*   (2006.01)
  (Continued)

(52) U.S. Cl.
  CPC ............. *G11C 16/26* (2013.01); *G11C 16/08* (2013.01); *G11C 16/16* (2013.01); *G11C 16/3459* (2013.01); *G11C 16/3481* (2013.01)

(58) Field of Classification Search
  CPC ......... G11C 16/26; G11C 16/08; G11C 16/16; G11C 16/3459; G11C 16/3481
  (Continued)

(56) References Cited

U.S. PATENT DOCUMENTS 8,279,668 B2 * 10/2012 Cho .................... G11C 11/5628
                                                 365/201
8,499,215 B2    7/2013 Kong et al.
(Continued)

FOREIGN PATENT DOCUMENTS

EP        2513907 A1   10/2012
KR   20170015757 A    2/2017
(Continued)

OTHER PUBLICATIONS

Cai et al. "Error characterization, Mitigation, and Recovery in Flash-Memory-Based Solid-State Drives," Proceedings of the IEEE, vol. 105, No. 9, pp. 1666-1704, Sep. 2017, doi: 10.1109/JPROC.2017.2713127, <https://arxiv.org/?pdf/1706.08642.pdf>.
(Continued)

*Primary Examiner* — Son L Mai
(74) *Attorney, Agent, or Firm* — Patterson & Sheridan, LLP; Steven H. VerSteeg

(57) ABSTRACT

A data storage device includes one or more memory devices that each includes one or more superblocks and a controller coupled to the one or more memory devices. Each superblock includes a plurality of wordlines. The controller is configured to write data to a first wordline of the plurality of wordlines, write data to a second wordline of the plurality of wordlines, perform a read verify operation on the first wordline, and perform a read verify operation on the second wordline. At least one of the first wordline and the second wordline does not include an XOR parity element and one or more wordlines of the plurality of wordlines includes the XOR parity element.

24 Claims, 11 Drawing Sheets

(51) Int. Cl.
*G11C 16/16* (2006.01)
*G11C 16/34* (2006.01)

(58) Field of Classification Search
USPC .................................. 365/189.011, 185.33
See application file for complete search history.

(56) References Cited

U.S. PATENT DOCUMENTS

| | | | |
|---|---|---|---|
| 8,775,901 | B2 | 7/2014 | Sharon et al. |
| 8,902,652 | B1* | 12/2014 | Huang ............... G11C 11/5621 |
| | | | 365/189.08 |
| 9,619,321 | B1 | 4/2017 | Haratsch et al. |
| 10,025,662 | B2 | 7/2018 | Yang et al. |
| 10,101,942 | B1 | 10/2018 | Parker et al. |
| 10,339,000 | B2 | 7/2019 | Yang et al. |
| 10,769,014 | B2 | 9/2020 | Cariello |
| 10,789,126 | B2 | 9/2020 | Singidi et al. |
| 11,309,051 | B2* | 4/2022 | Asami ................... G11C 16/10 |
| 2012/0008389 | A1* | 1/2012 | Kim ..................... G11C 11/5642 |
| | | | 365/185.18 |
| 2018/0012666 | A1 | 1/2018 | Kim |
| 2018/0025776 | A1 | 1/2018 | Achtenberg et al. |
| 2020/0118636 | A1 | 4/2020 | Athreya et al. |
| 2020/0194064 | A1 | 6/2020 | Barndt et al. |

FOREIGN PATENT DOCUMENTS

| | | |
|---|---|---|
| WO | 2011075597 A1 | 6/2011 |
| WO | 2017087059 A2 | 5/2017 |

OTHER PUBLICATIONS

International Search Report and the Written Opinion for International Application No. PCT/US2020/066420 dated Apr. 7, 2021, 11 pages.
Benoit, Anne, "Efficient Checkpoint/Verification Patterns for Silent Error Detection", ICL Research Report, RR-1403, 2014 (16 pages).

* cited by examiner

| Source of UECC data errors | The errors to be fixed using XOR in NAND | | | | | XOR PARITY | | |
|---|---|---|---|---|---|---|---|---|
| | PSF program failures | Silent program failures | | | wear, DR | | | |
| input metric | BFR/PE cycle | | | | SFR | | | |
| category | WL-WL short and smaller | WL-WL short and smaller | 1-EB, 2-EB, plane, die | | random UECC CWs (SFR) | XOR Parity level | parity ratio examples | Temp data source or XOR holding | Read Verify / EPWR** level |
| QLC, baseline, Full Die Redundancy (1:31 parity ratio) | | | | | | | | |
| SLC blocks (host writes) | v | v | | | v | FDR | 1:31 | n/a* |
| QLC (copy from SLC or QLC) | | v | v | | v | FDR | 1:31 | 2WL deep |
| QLC ESS drive path (conventional, 32 die super-blocks) | | | | | | | | |
| SLC blocks (host writes) | v | v | v | | v | e.g. FDR | 1:31 | |
| 1. no extra checks | | v | v | | v | less than SLCs | 1:63 | 2WL deep |
| 2. with FW read verify/ EPWR | | v | v | | v | even less | 1:127 | 2WL deep |
| 3. with FW read verify/ EPWR | | | | | v | even less | 1:255 | 1-EB deep |
| 4. with FW read verify/ EPWR | | | | | v | even less | 1:383 | 1-EB deep |
| 5. with FW read verify/ EPWR | | | | | | none | none | 1-EB deep |

EPWR = FW Read Verify - may not detect 100% of errors

*limited by host buffers, may add extra temp parity (Q-Parity)

** exact data verification design depends on the failure type and geometry. Smaller error require higher verification overhead.

FIG. 4

| | | Plane 0 | | | | Plane 1 | | | | Legend | |
|---|---|---|---|---|---|---|---|---|---|---|---|
| w/ PSF (SELSTRING | | | | | | | | | | | |
| | | | | | | | | | | | OK |
| | WL(N-x) | | | | | | | | | ▨ | UECC/Short |
| | WL(N-1) | | | | | | | | | | |
| | WL(n) | | | ▦ | | | | | | ▦ | PSF |
| | | 50 | 51 | 52 | 53 | 50 | 51 | 52 | 53 | | |
| w/ PSF (SELSTRING) + UECC on WL + UECC on (SELSTRING) | | | | | | | | | | | |
| | | Plane 0 | | | | Plane 1 | | | | Legend | |
| | WL(N-x) | | | | | | | | | | OK |
| | WL(N-1) | | | | | | | | | ▨ | UECC/Short |
| | WL(n) | | | ▦ | | | | | | ▦ | PSF |
| | | 50 | 51 | 52 | 53 | 50 | 51 | 52 | 53 | | |
| w/ PSF (SELSTRING) + UECC on WL + UECC on (SELSTRING) + UECC on WLn-1 + UECC on Previous Strings | | | | | | | | | | | |
| | | Plane 0 | | | | Plane 1 | | | | Legend | |
| | WL(N-x) | | | | | | | | | | OK |
| | WL(N-1) | | | ▨ | | | | | | ▨ | UECC/Short |
| | WL(n) | ▨ | ▨ | ▦ | | | | | | ▦ | PSF |
| | | 50 | 51 | 52 | 53 | 50 | 51 | 52 | 53 | | |
| w/ PSF (SELSTRING) + PSF WL ADJ + PSF (SELSTRING) ADJ + UECC on WL + UECC on (SELSTRING) + UECC on WL ADJ + UECC on (SELSTRING) ADJ | | | | | | | | | | | |
| | | Plane 0 | | | | Plane 1 | | | | Legend | |
| | WL(N-x) | | | | | | | | | | OK |
| | WL(N-1) | | | | | | | | | ▨ | UECC/Short |
| | WL(n) | | | ▦ | | | | ▦ | | ▦ | PSF |
| | | 50 | 51 | 52 | 53 | 50 | 51 | 52 | 53 | | |
| w/ PSF (SELSTRING) + UECC on WL + UECC on (SELSTRING) + UECC on Previous Strings + UECC WL ADJ + UECC on Previous String ADJ | | | | | | | | | | | |
| | | Plane 0 | | | | Plane 1 | | | | Legend | |
| | WL(N-x) | | | | | | | | | | OK |
| | WL(N-1) | | | | | | | | | ▨ | UECC/Short |
| | WL(n) | ▨ | ▨ | ▦ | | ▨ | ▨ | | | ▦ | PSF |
| | | 50 | 51 | 52 | 53 | 50 | 51 | 52 | 53 | | |

FIG. 5A

| w/ PSF (SELSTRING) + UECC (1 or More WL) + UECC on WLn-1 + UECC on (SELSTRING) + UECC on Previous Strings + PSF WL ADJ + PSF on (SELSTRING) ADJ + UECC (1 or More WL) ADJ + UECC on WLn-1 ADJ + UECC (SELSTRING) ADJ + UECC on Previous Strings ADJ | | Plane 0 | | | | Plane 1 | | | | Legend | |
|---|---|---|---|---|---|---|---|---|---|---|---|
| | WL(N-x) | | | ░ | | | | ░ | | | OK |
| | WL(N-1) | | | | ░ | | | | ░ | ▨ | UECC/Short |
| | WL(n) | ▨ | ▨ | ▨ | ▦ | ▨ | ▨ | ▨ | ▦ | ▦ | PSF |
| | | 50 | 51 | 52 | 53 | 50 | 51 | 52 | 53 | ░ | possible UECC |

| w/ PSF (SELSTRING) + UECC (1 or More WL) + UECC on WLn-1 + UECC on (SELSTRING) + UECC on Previous Strings + PSF WL ADJ on (SELSTRING) ADJ | | Plane 0 | | | | Plane 1 | | | | Legend | |
|---|---|---|---|---|---|---|---|---|---|---|---|
| | WL(N-x) | | | ░ | | | | | | | OK |
| | WL(N-1) | | | | ░ | | | | | ▨ | UECC/Short |
| | WL(n) | ▨ | ▨ | ▨ | ▦ | | | | ▦ | ▦ | PSF |
| | | 50 | 51 | 52 | 53 | 50 | 51 | 52 | 53 | ░ | possible UECC |

Silent errors (no PSF)

Single WL UECC Failure

| | | Plane 0 | | | | Plane 1 | | | | Legend | |
|---|---|---|---|---|---|---|---|---|---|---|---|
| | WL(N-x) | | | | | | | | | | OK |
| | WL(N-1) | | | | | | | | | ▨ | UECC/Short |
| | WL(n) | ▨ | ▨ | ▨ | | | | | | ▦ | PSF |
| | | 50 | 51 | 52 | 53 | 50 | 51 | 52 | 53 | ░ | possible UECC |

All WL UECC Failure

| | | Plane 0 | | | | Plane 1 | | | | Legend | |
|---|---|---|---|---|---|---|---|---|---|---|---|
| | WL(N-x) | ▨ | ▨ | ▨ | | | | | | | OK |
| | WL(N-1) | ▨ | ▨ | ▨ | | | | | | ▨ | UECC/Short |
| | WL(n) | ▨ | ▨ | ▨ | | | | | | ▦ | PSF |
| | | 50 | 51 | 52 | 53 | 50 | 51 | 52 | 53 | ░ | possible UECC |

| UECC (1 or More WL) + UECC on WLn-1 + UECC on (SELSTRING) + UECC on Previous Strings + UECC on WL ADJ + UECC on (SELSTRING) ADJ + UECC on Previous Strings ADJ | | Plane 0 | | | | Plane 1 | | | | Legend | |
|---|---|---|---|---|---|---|---|---|---|---|---|
| | WL(N-x) | | | ░ | | | | | | | OK |
| | WL(N-1) | | | | ░ | | | | | ▨ | UECC/Short |
| | WL(n) | ▨ | ▨ | ▨ | | ▨ | ▨ | ▨ | | ▦ | PSF |
| | | 50 | 51 | 52 | 53 | 50 | 51 | 52 | 53 | ░ | possible UECC |

FIG. 5B

QLC DATA PROGRAMMING

CROSS-REFERENCE TO RELATED APPLICATIONS

This application claims benefit of U.S. provisional patent application Ser. No. 63/109,114, filed Nov. 3, 2020, which is herein incorporated by reference.

BACKGROUND OF THE DISCLOSURE

Field of the Disclosure

Embodiments of the present disclosure generally relate to improving programming to data storage devices, such as solid state drives (SSDs).

Description of the Related Art

Programming or writing data may require two writing phases: foggy and fine. In foggy-fine programming, the bits to be written cannot simply be written once. Rather, the data needs to be first written by foggy programming where voltage pulses are provided to push the current state to a more resolved state, but not a completely resolved state. Fine programming is performed at a point in time after foggy programming to write the data again in the completely resolved state.

While programing or writing data to the respective locations of the data storage device, program failures, such as bit errors, may accumulate. In order to fix the program failures, exclusive or (XOR) parity data is generated by an error correction engine, such as a parity engine or a low density parity check (LDPC) engine. The XOR parity data is stored in each location of the data write. For example, if data is fine programmed to a first non-volatile memory device, the data is first programmed to a volatile memory device cache or to a second non-volatile memory device cache. The data is then foggy program to the first non-volatile memory device. After completing the foggy program to the first non-volatile memory device, the data is fine programmed to the first non-volatile memory device. XOR parity data may be generated and stored along with the programmed data in each location of the data programming sequence, such as in the volatile memory device cache, the second non-volatile memory device cache, the foggy program to the first non-volatile memory device, and the fine program to the first non-volatile memory device. The accumulation of XOR parity data in each memory device previously mentioned increases the XOR parity overhead and reduces over provisioning or capacity for user data in the data storage device.

Therefore, there is a need in the art for improved programming to the non-volatile memory while decreasing the XOR parity overhead and maintaining or increasing the reliability of the data storage device.

SUMMARY OF THE DISCLOSURE

The present disclosure generally relates to improving programming to data storage devices, such as solid state drives (SSDs). A first memory device has a first XOR element and a second memory device has a second XOR element. The ratio of the first XOR element to the capacity of the first memory device is substantially smaller than the ratio of the second XOR element to the capacity of the second memory device. A read verify operation to find program failures is executed on either a wordline to wordline basis, an erase block to erase block basis, or both a wordline to wordline basis and an erase block to erase block basis. Because the program failures are found and fixed prior to programming to the second memory device, the second XOR element may be decreased substantially.

In one embodiment, a data storage device includes one or more memory devices that includes one or more superblocks, where each superblock of the one or more superblocks includes a plurality of wordlines, and a controller coupled to the one or more memory devices. The controller is configured to write data to a first wordline of the plurality of wordlines, write data to a second wordline of the plurality of wordlines, perform a read verify operation on the first wordline, and perform a read verify operation on the second wordline, where at least one of the first wordline and the second wordline does not include an XOR parity element.

In another embodiment, a data storage device includes one or more memory devices that includes one or more superblocks, where each superblock of the one or more superblocks includes a plurality of erase blocks, and where each erase block of the plurality of erase blocks includes a plurality of wordlines. The data storage device further includes a controller coupled to the one or more memory devices. The controller is configured to write data to the plurality of wordlines of a first erase block of the plurality of erase blocks of at least one memory device of the one or more memory devices, where less than all of the plurality of wordlines includes an XOR element, and perform a read verify operation to less than all of the plurality of wordlines of the first erase block after the first entire erase block has been programmed.

In another embodiment, a data storage device includes a first memory device having a first XOR storage capacity for a first XOR element, where the first XOR storage capacity relative to data stored in the first memory device is a first ratio. The data storage device further includes a second memory device having a second XOR storage capacity for a second XOR element, where the second XOR storage capacity relative to data stored in the second memory device is a second ratio, and where the second ratio is different from the first ratio. The data storage device further includes a volatile memory and a controller means coupled to the first memory device and the second memory device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is an illustration of the possible options of exclusive or (XOR) in a multi-level cell, according to disclosed embodiments.

FIGS. 5A and 5B are illustrations of various program failure types, according to disclosed embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improving programming to data storage devices, such as solid state drives (SSDs). A first memory device has a first XOR element and a second memory device has a second XOR element. The ratio of the first XOR element to the capacity of the first memory device is substantially smaller than the ratio of the second XOR element to the capacity of the second memory device. A read verify operation to find program failures is executed on either a wordline to wordline basis, an erase block to erase block basis, or both a wordline to wordline basis and an erase block to erase block basis. Because the program failures are found and fixed prior to programming to the second memory device, the second XOR element may be decreased substantially.

Figure 1:
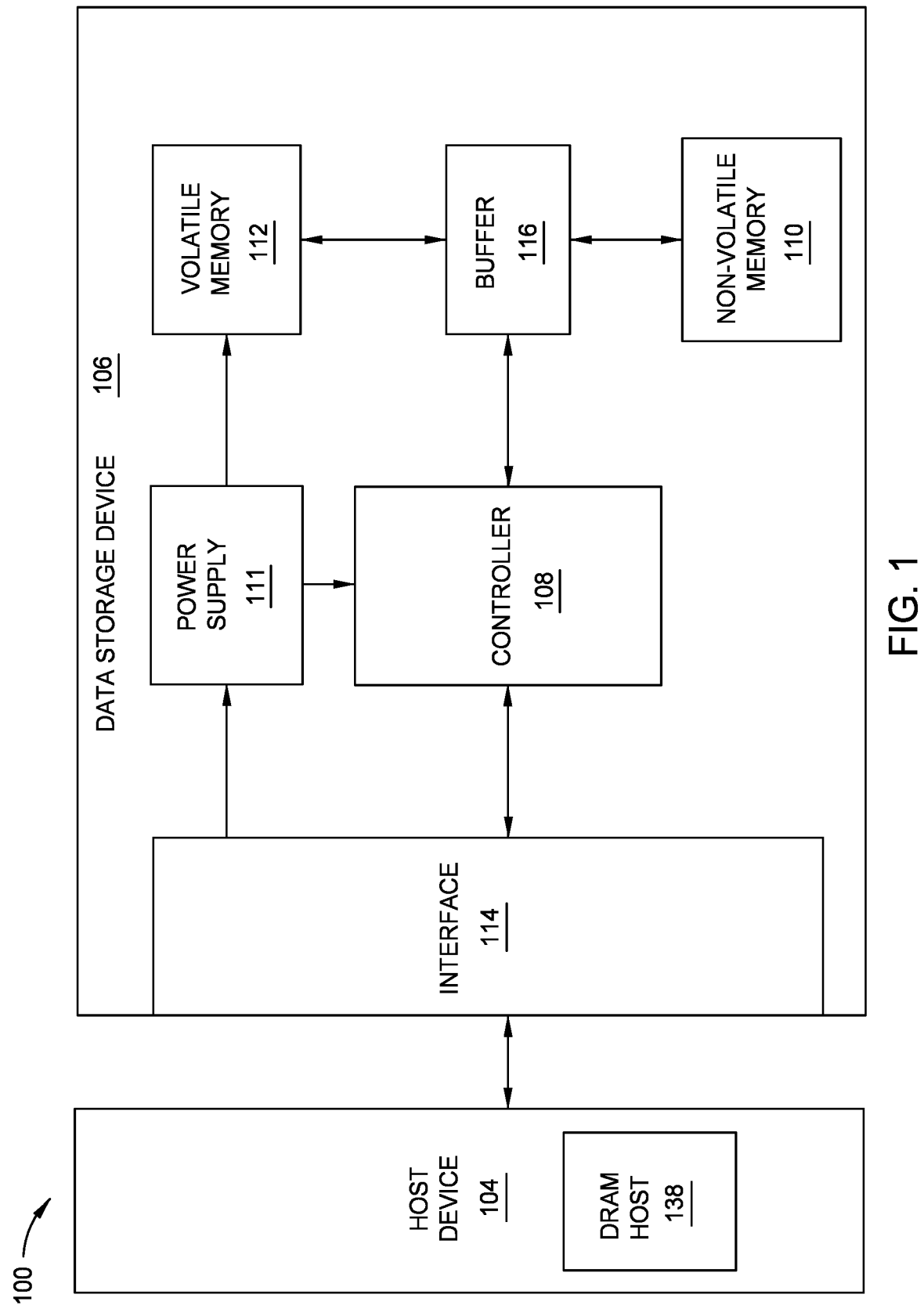
FIG. 1 is a schematic block diagram illustrating a storage system in which data storage device may function as a storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes the host device 104, which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
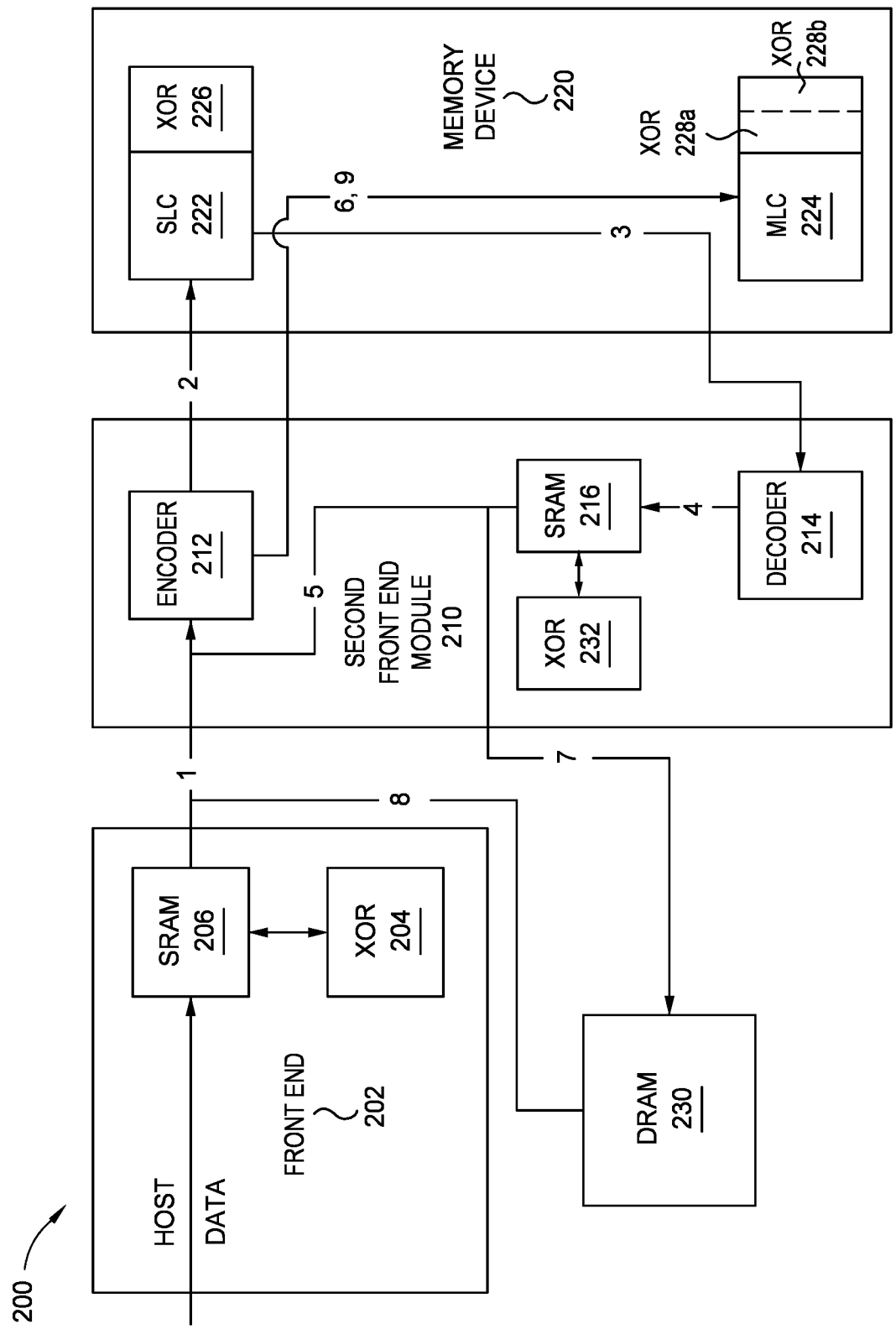
FIG. 2 is a schematic illustration of scheduling foggy-fine programming, according to disclosed embodiments.

FIG. 2 is a schematic illustration of scheduling foggy-fine programming, according to disclosed embodiments. The Front End (FE) module 202 comprises a first XOR engine 204 and a first static random-access memory (SRAM) 206. Host data may be initially delivered to the FE module 202. The data passes through the first XOR engine 204 and is written to the first SRAM 206. The first XOR engine 204 generates XOR parity information prior to writing to the first SRAM 206. Exclusive OR (XOR) parity information is used to improve reliability of storage device for storing data, such as enabling data recovery of failed writes or failed reads of data to and from NVM or enabling data recovery in case of power loss. The storage device may be the data storage device 106 of FIG. 1. The reliability may be provided by using XOR parity information generated or computed based on data stored to storage device. The first XOR engine 204 may generate a first parity stream to be written to the first SRAM 206. The first SRAM 206 may contain a plurality of dies to which data may be written.

The Second Flash Manager (FM2) module 210 comprises of an encoder 212, a second SRAM 216, a decoder 214, and a second XOR engine, where the second XOR engine is configured to generate a second parity stream to be written to the second SRAM 216. The decoder 214 may comprise a low gear (LG) decoder and a high gear (HG) decoder. The LG decoder can implement low power bit flipping algorithms, such as a low density parity check (LDPC) algorithm. The LG decoder may be operable to decode data and correct bit flips where such data has a low bit error rate (BER). The HG decoder can implement full power decoding and error correction algorithms, which may be initiated upon a failure of the LG decoder to decode and correct bit flips in data. The HG decoder can be operable to correct bit flips where such data has a high BER. Alternatively, FM2 may be replaced with a combined FE-FM monochip.

The encoder 212 and decoder 214 (including the LG decoder and HG decoder) can include processing circuitry or a processor (with a computer-readable medium that stores computer-readable program code (e.g., firmware) executable by the processor), logic circuitry, an application specific integrated circuit (ASIC), a programmable logic controller, an embedded microcontroller, a combination thereof, or the like, for example. In some examples, the encoder 212 and the decoder 214 are separate from the storage controller, and in other examples, the encoder 212 and the decoder 214 are embedded in or part of the storage controller. In some examples, the LG decoder is a hardened circuit, such as logic circuitry, an ASIC, or the like. In some examples, the HG decoder can be a soft decoder (e.g., implemented by a processor). Data may be written to second SRAM 216 after being decoded at the decoder 214. The data at the second SRAM 216 may be further delivered to the encoder 212, as discussed below.

The memory device 220 may be a NAND memory device. The memory device 220 may comprise a SLC memory 222 and a MLC memory 224. It is to be understood that the embodiments discussed herein are applicable to any multi-level cell memory such as MLC memory, TLC memory, or QLC memory. MLC memory is simply exemplified. SLC memory, MLC memory, TLC memory, QLC memory, and PLC memory are named according to the number of bits that a memory cell may accept. For example, SLC memory may accept one bit per memory cell and QLC memory may accept four bits per memory cell. Each bit is registered on the storage device as a 1 or a 0. Additionally, while SLC memory is exemplified as a memory device, it is also contemplated that the SLC memory may be replaced with a 2-bit cell or a MLC memory.

Furthermore, the SLC memory 222 includes a SLC exclusive or (XOR) partition 226, where the SLC XOR partition 226 stores parity or XOR data. Similarly, the MLC memory 224 includes a first MLC XOR partition 228a and a second MLC XOR partition 228b, where the first MLC XOR partition 228a and the second MLC XOR partition 228b may be referred to as a MLC XOR partition 228 collectively for exemplary purposes. In some embodiments, the MLC memory 224 does not include a MLC XOR partition 228. In other embodiments, the MLC memory 224 includes a first MLC XOR partition 228a and, optionally, a second MLC XOR partition 228b. It is to be understood that when the MLC memory 224 includes the first MLC XOR partition 228a and the second MLC XOR partition 228b, the MLC XOR partition 228 may be continuous, such that the distinction between the first MLC XOR partition 228a and the second MLC XOR partition 228b is for illustrative purposes.

Host data is written to the first SRAM 206 of the FE module 202. First XOR parity data may be generated, concurrently, at the first XOR engine 204 of the FE module 202 as the host data is written to the first SRAM 206. The host data and the generated first XOR parity data passes from the first SRAM 206 to the encoder 212 to be encoded along stream 1. The host data is encoded and written to the SLC memory 222. Likewise, the generated first XOR parity data is encoded and written to the SLC XOR partition 226 of the memory device 220 along stream 2. The SLC memory 222 may be a region of the memory device 220 dedicated to protecting data in case of a power loss event. The programming to the SLC memory 222 and the programming to the MLC memory 224 are decoupled, which may allow for increased scheduling flexibility and performance. The host data may further be sorted from the SLC memory 222 to multiple streams or erase blocks of the MLC memory 224.

At stream 3, the host data is read from the SLC memory 222 at the decoder 214. After the host data is decoded at the decoder 214, the host data is written to the second SRAM 216 of the FM2 210 along stream 4, where second XOR parity data is further generated for the host data at the second XOR engine 232 of the FM2 210. The host data and second XOR parity data are passed through the encoder 212 to be encoded along stream 5 and are foggy written to the respective locations of the MLC memory 224 and the MLC XOR partition 228 along stream 6. During the foggy write, the controller may selectively choose data to read in order to allow for data sorting into the relevant one or more streams.

The host data and the generated second XOR parity data are further transferred along stream 7 from the second SRAM 216 to the DRAM 230. In one embodiment, stream 5 and stream 7 occur concurrently. In another embodiment, stream 5 occurs prior to stream 7. The DRAM 230 may be additional volatile memory of the storage device, such as the storage device 106 of FIG. 1. Furthermore, the DRAM 230 may stage (e.g., a temporary buffer) the host data and the second XOR parity data until the relevant wordline associated with the host data can be fine written. The host data and the second XOR parity data are further transferred from the DRAM 230 to the encoder 212 to be encoded along stream 8. After being encoded, the host data and the second XOR parity data are fine written to the respective locations of the MLC memory 224 and the MLC XOR partition 228 along stream 9.

Figure 3:
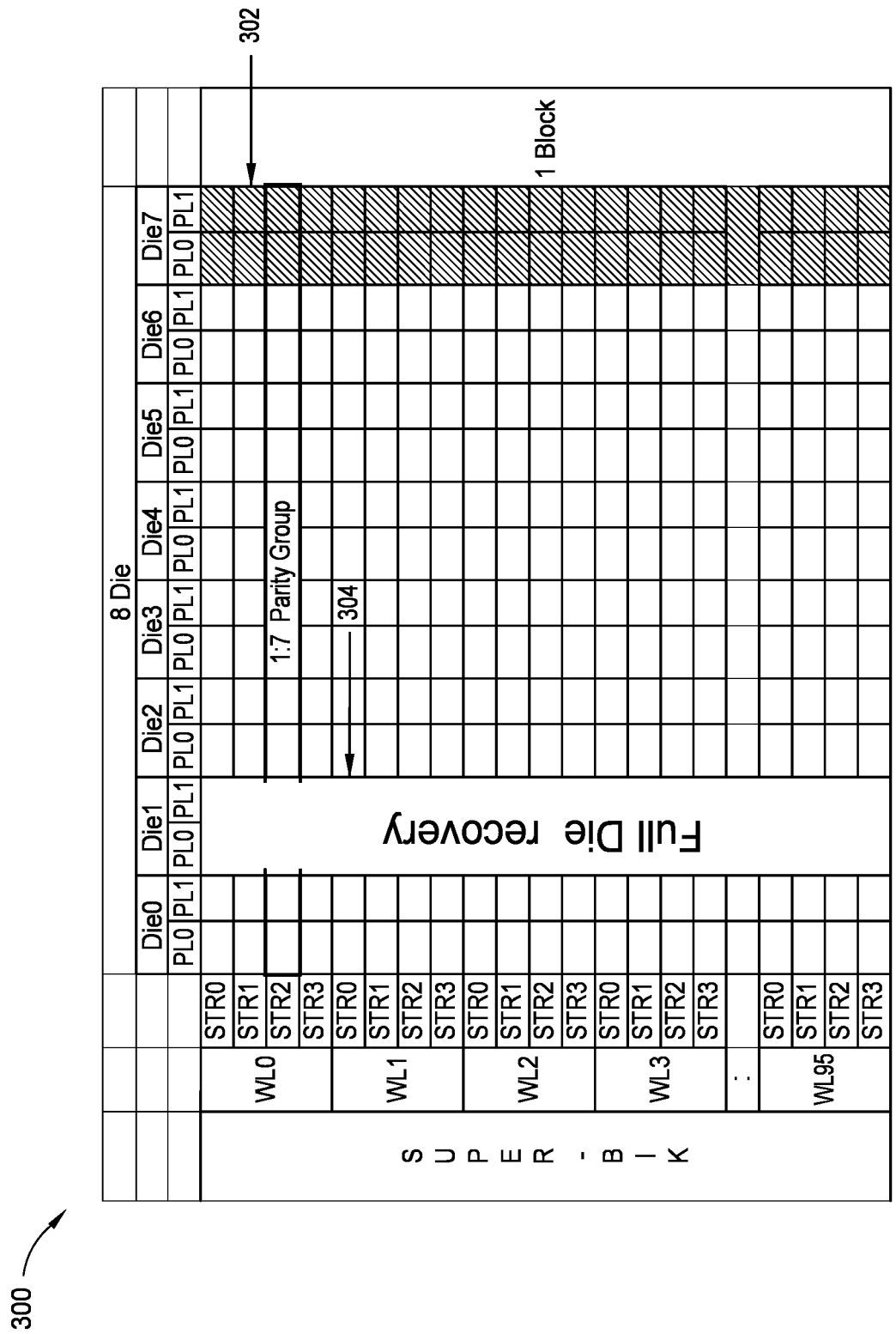
FIG. 3 is a schematic illustration of a horizontal exclusive or (XOR) scheme with full die redundancy of a super block, according to disclosed embodiments.

FIG. 3 is a schematic illustration of a horizontal exclusive or (XOR) scheme with full die redundancy of a superblock 300, according to disclosed embodiments. The superblock 300 includes a plurality of dies (e.g., dies 0-7) and a plurality of wordlines (WL) (e.g., WLs 0-95). The listed number of dies and wordlines are not intended to be limiting, but are shown to exemplify a possible embodiment. For example, the superblock may include about 32 dies and more than or less than about 96 WLs. Each die of the plurality of dies includes a first plane, indicated by PL0, and a second plane, indicated by PL1. Furthermore, each of wordline of the plurality of wordlines includes four strings (STR). The number of strings per wordline is based on the type of memory cell of the superblock. For example, QLC memory includes four strings per wordline, TLC memory includes three strings per wordline, and SLC memory includes one string per wordline.

The superblock 300 may be an example of a zone namespace architecture that includes seven dies for data and an eighth die for XOR parity data. Die 7 of the superblock 300 is associated with XOR parity data 302. Because die 7 includes only XOR parity data 302, the XOR parity data 302 may recover another failed die 304, such as die 1, where recovering the another failed die 304 includes recovering all of the data of the failed die (i.e., full die redundancy). Furthermore, because each string, such as string 2 of WL 0, spans across each of the eight dies, each string includes 16 planes. Because die 7 includes XOR parity data 302, the parity group ratio is about 1:7, where the XOR parity data overhead is about 12.5% (i.e., ⅛). The listed values are not intended to be limiting, but to provide an example of possible embodiment.

FIG. 4 is an illustration of the possible options of exclusive or (XOR) in a multi-level cell, according to disclosed embodiments. Sources of uncorrectable error correction code (UECC) data errors includes program status failures (PSF), silent program failures, and wear and data retention related random failures. The PSF and the silent program failures may be associated with the bit failure rate (BFR) and/or the program erase (PE) cycle. The wear and DR related random failures may be associated with the sector failure rate (SFR).

The "XOR parity" column illustrates the type of XOR parity included in each embodiment. For example, a full die redundancy (FDR) may recover an entire failed die. However, the XOR parity data associated with the FDR may require a large amount of storage space in the superblock, thus reducing the amount of data that may be stored in the superblock. XOR parity data or any other parity schemes for multiple error correction code (ECC) codewords, such as low-density parity-check (LDPC), may be used to recover failed bits of data. For example, when the failed bit count (FBC) is larger than a threshold value, the controller, such as the controller 108 of FIG. 1, may utilize the XOR parity data to recover the failed bits, such that the data associated with the failed bits is no includes the failed bits.

Another example of a data error is a program failure, where the program failure size varies from one WL-string-plane to 2-erase block failure two planes. Unlike the FBC errors, where both XOR parity data and LDPC may be used to correct the FBC errors, XOR parity data and similar parity schemes may be used to correct program failures. Program failures, such as PSF, may be fixed by writing data in a different location of the superblock. For example, when a cell has an unacceptable bit error rate (UBER), the controller may avoid programming data to the cell that has an UBER. However, silent program failures may be undetectable by the controller and are passed to the NVM, such as the NVM 110 of FIG. 1, unnoticed. Silent program failures may result in double, triple, or higher errors that reduce the reliability of the data storage device, such as the data storage device 106 of FIG. 1.

In order to protect user data from failure due to the program failures, the XOR parity data scheme needs to be large enough (i.e., low XOR parity ratio) to protect against any combinations of the program failures previously described and any program failures not described, but contemplated, and have the correct geometry as well. However, the XOR parity data scheme size has limitations. For example, by increasing the size of the XOR parity data scheme, less user data or any other data may be stored in the NVM since the XOR parity data takes up more memory in the NVM, where the more memory could be utilized to store more user data.

The "extra measures" column refers to the temporary storage of data in a cache or a buffer or the level of read verify/enhanced post write read (EPWR) used to check for and fix errors. For example, the buffer or the cache may store up to the last two wordlines (2WL deep) of data written to the superblock. When another wordline is written to the superblock, the oldest wordline of the last two wordlines stored in the buffer or the cache is released, such that releasing the wordline refers to erasing the data. Furthermore, the read verify/EPWR level refers to the frequency of the read verify/EPWR operations. For example, a read verify/EPWR level of a wordline signifies that after a wordline is programmed, the read verify/EPWR operation occurs.

As illustrated in FIG. 4, each time there is an additional firmware (FW) read verify/EPWR check, the XOR parity ratio decreases. For example, at the first FW read verify/EPWR check embodiment 404, where the data is copied from the SLC memory, such as the SLC memory 222 of FIG. 2, to the MLC memory, such as the MLC memory 224 of FIG. 2, the XOR parity ratio is about to about 1:127. As a comparison, the no extra checks embodiment 402 has an XOR parity ratio of about 1:63. The first FW read verify/EPWR check embodiment 404 includes a read verify/EPWR level of a wordline. Furthermore, the cache or the buffer stores the last two wordlines (e.g., 2WL deep) of data written to the superblock. By further performing read verify/EPWR checks, such as the fourth FW read verify/EPWR check embodiment 406, the XOR parity ratio may be substantially decreased to about 0, where the buffer or the cache stores the last erase block written to the super block and the read verify/EPWR operation occurs after each time a wordline, an erase block, or both a wordline and an erase block are programmed to.

The XOR parity data ratio as well as overhead may be reduced if the PSF does not need to be corrected. For example, if the data, such as up to the last two wordlines written or the last erase block programmed, is still available in the source blocks, such as the SLC memory, the buffer, and/or the cache, the data in the source blocks may be programmed over the PSF failures. In another example, a temporary XOR parity data may be stored in the buffer, the cache, and/or the volatile memory, such as the volatile memory 112 of FIG. 1, where, in the case of a PSF, one XOR parity element (i.e., XOR parity data) per cached XOR stripe (i.e., one die, last two wordlines) may be fixed.

Furthermore, the XOR parity data ratio as well as overhead may be reduced if the silent program failures do not need to be fixed. For example, if the data, such as up to the last two wordlines written or the last erase block programmed, is still available in the source blocks, such as the SLC memory, the buffer, and/or the cache, the data in the source blocks may be programmed over the PSF failures. Furthermore, if additional FW read verify/EPWR operations detect the silent program failures by looking for the error signatures for the silent program failure types, the XOR parity ratio and overhead may be reduced. Referring to FIG. 2, the XOR parity ratio of the SLC memory 222 and the SLC XOR partition 226 may be about 1:7, where for every 1 die of XOR parity data, 7 dies are appropriated to data. Likewise, the XOR parity ratio of the MLC memory 224 and the MLC XOR partition 228 (the combined first MLC XOR partition 228a and the second MLC XOR partition 228b) may be about 1:7. However, by performing additional FW read verify/EPWR operations on the data programed to the MLC memory 224, the XOR parity ratio of the MLC memory 224 and the MLC XOR partition 228 may be about 1:15, about 1:31, about 1:63, about 1:127, about 1:255, about 1:383, or the like, where the MLC XOR partition 228 includes the first MLC XOR partition 228a. It is contemplated that the XOR parity ratio of the MLC memory 224 and the MLC XOR partition 228 may be about 0 where no XOR parity data is stored in the MLC XOR partition 228.

For example, each wordline may be checked for silent program failures when written to a superblock of the MLC memory. In some embodiments, each plane and/or each string of the wordline is also checked for silent program failures. Though the overhead of the operation may be large, silent program failures do not get programmed to the MLC memory unnoticed. Furthermore, because each wordline is checked, only a minimal number of wordlines, such as up to about two wordlines, may be stored in the buffer, the cache, and/or the volatile memory. Thus, the latency of copying the wordlines from the stored location to the MLC memory or the latency of releasing the wordlines from the stored location may be negligible or small.

In another example, the FW read verify/EPWR operation may check for whole erase block failures. When checking for whole erase block failures, only a few wordlines need to be checked at the end of programming the erase block, thus making the overhead of the operation smaller than the overhead of the operation of checking each wordline. In one embodiment, the number of wordlines checked may be about two wordlines, where the about two wordlines checked are the last wordlines of the programmed erase block. However, because the erase block is checked at the completion of the erase block program to the MLC memory, the source blocks associated with the data of the erase block may need to be stored in the SLC memory, the buffer, and/or the cache. Because storing the source blocks associated with the erase block is larger than storing the last two wordlines programmed to the MLC memory, the latency of releasing the source block from the relevant location may be larger than the latency of releasing up to about two wordlines.

In yet another example, the FW read verify/EPWR operation may check for both erase block and wordline failures. After the erase block has been programmed to the MLC memory, each wordline of the erase block is checked for wordline failures. In some embodiments, each plane and/or each string of the wordline is checked for program failures. Because each wordline of the erase block is checked at the completion of the erase block program to the MLC memory, the source blocks associated with the data of the erase block may need to be stored in the SLC memory, the buffer, and/or the cache. Because storing the source blocks associated with the erase block is larger than storing the last two wordlines programmed to the MLC memory, the latency of releasing the source block from the relevant location may be larger than the latency of releasing up to about two wordlines. Though the overhead of the operation may be larger than the previous two examples, the silent program failures may not be passed to the MLC memory unnoticed, thus enabling the highest reduction of XOR parity data, where the XOR parity data stored may be minimal or substantially about zero. In some embodiments, the only XOR parity data stored may be for wear and DR related random failures.

FIGS. 5A and 5B are illustrations of various program failure types, according to disclosed embodiments. It is to be understood that FIGS. 5A and 5B are, collectively, representative of a single figure split into two pages labeled FIG. 5A and FIG. 5B. The silent errors (i.e., silent program failures) do not include any PSF failures. Thus, the silent errors may be passed to the MLC memory, such as the MLC memory 224 of FIG. 2. However, as illustrated in the other examples of FIGS. 5A and 5B, by including at least one cell that has a PSF, the error may be noticed by the controller and the controller may correct the error utilizing XOR parity data, LDPC, and/or the like. The various program failure types may be UECC/short and PSF. In some embodiments, the program failures are along the borders of the superblock, such as the last wordline programmed (i.e., WL(n)) and/or the last string programmed (i.e., S3). By implementing a read verify/EPWR operation, such as the read verify/EPWR operations described in FIG. 4, the program failures illustrated in FIGS. 5A and 5B may not be programmed to the MLC memory. It is contemplated that other failure types not shown are applicable the embodiments described herein.

Figure 6A:
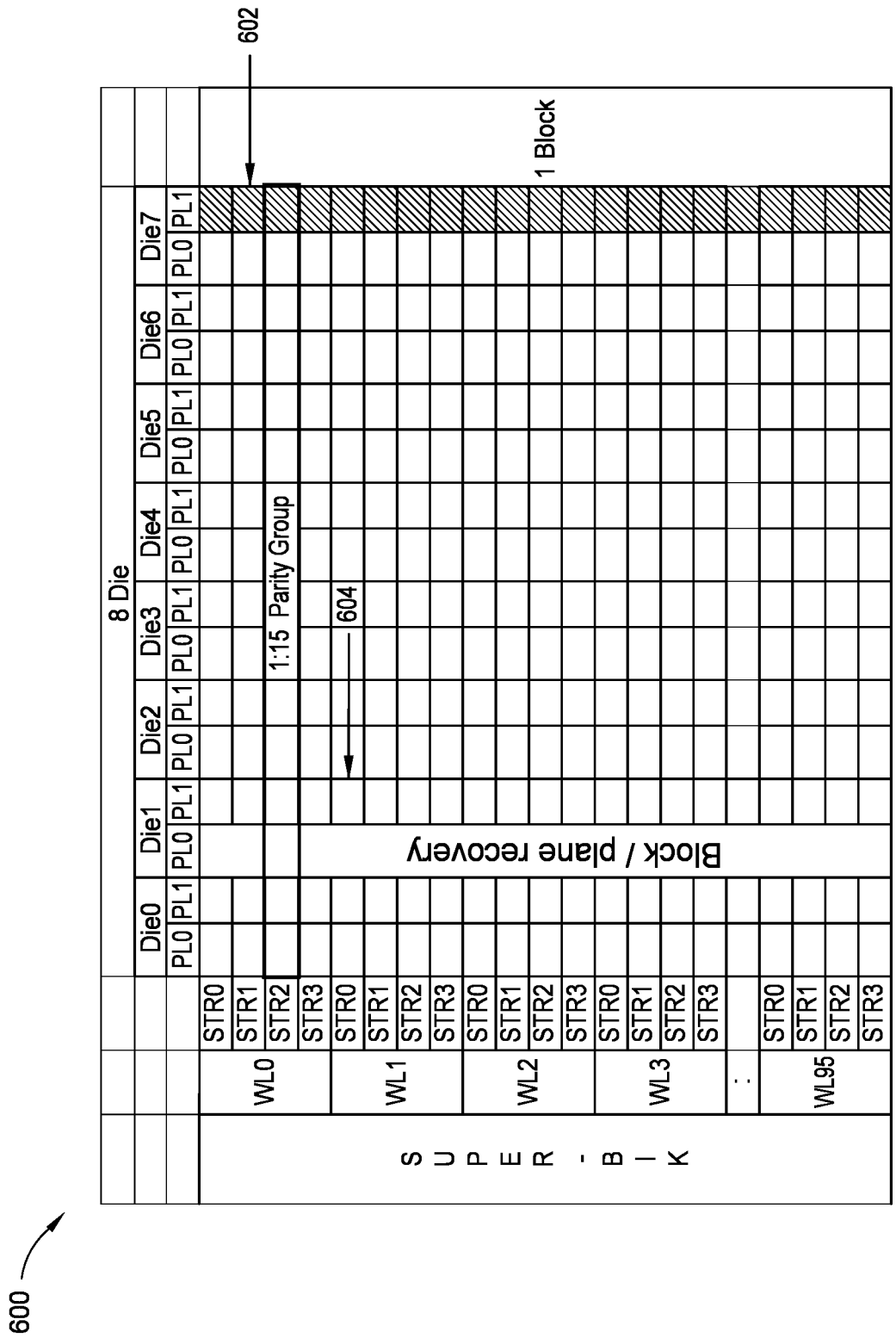
FIGS. 6A and 6B are schematic illustrations of a reduced horizontal exclusive or (XOR) scheme of a superblock, according to disclosed embodiments.
Figure 6B:
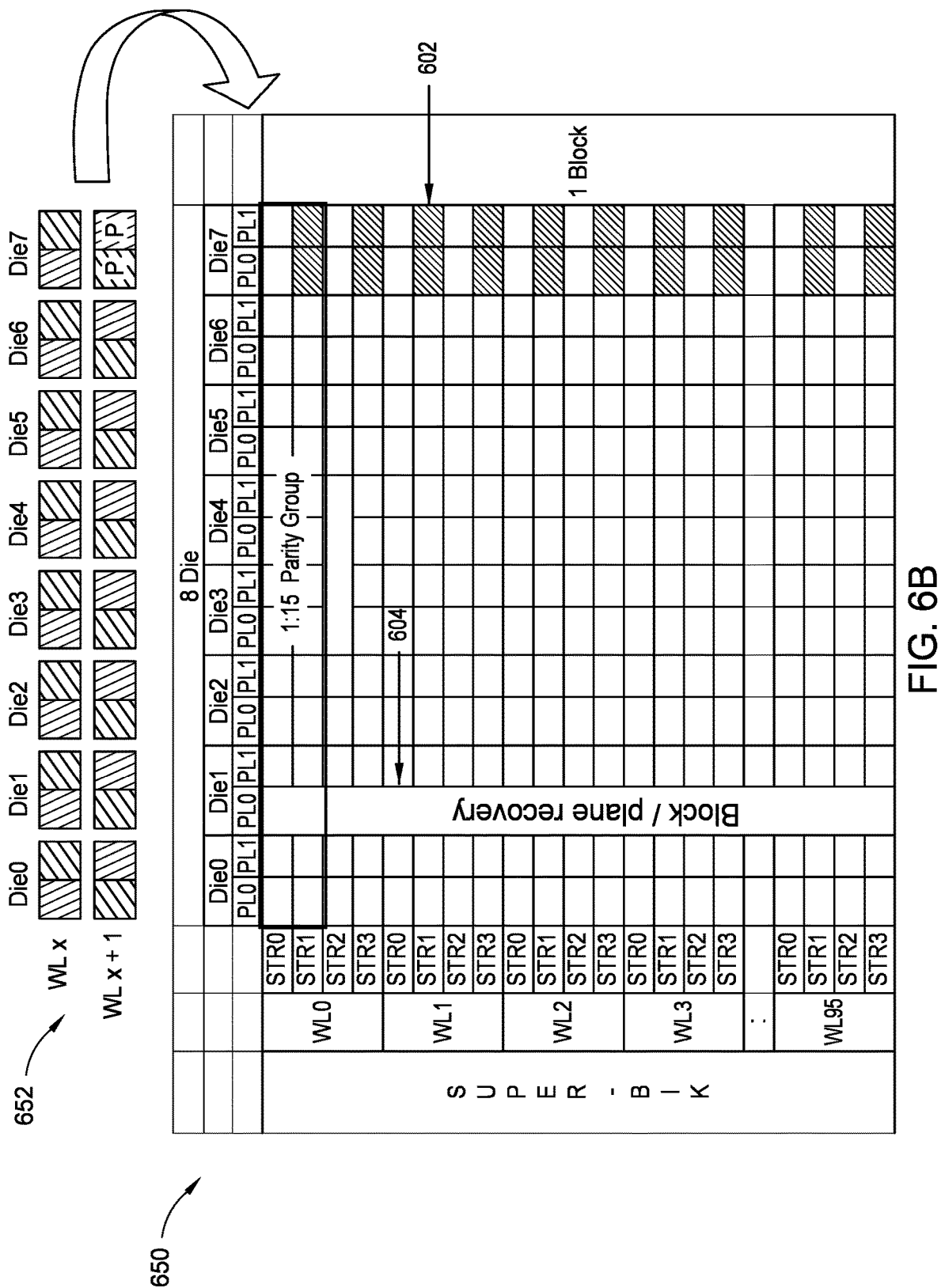

FIGS. 6A and 6B are schematic illustrations of a reduced horizontal exclusive or (XOR) scheme of a superblock 600, 650, according to disclosed embodiments. Aspects of the superblock 300 of FIG. 3 may be similar to the superblock 600 of FIG. 6A and the superblock 650 of FIG. 6B. Although a superblock scheme is exemplified, it is contemplated that the disclosed embodiments may be applicable to non-superblock schemes. The superblock scheme may refer to data striping across multiple dies, as to achieve a higher level of parallelism. The non-superblock scheme may refer to data striping across a single die. Furthermore, it is to be understood that while a horizontal XOR scheme is exemplified, the embodiments may be applicable to a reduced vertical XOR scheme. According to the horizontal XOR scheme, the XOR parity group/stripe spans horizontally across a data stripe, such that the last block or set of blocks of the horizontal data stripe is programmed with XOR parity data. The XOR parity data may protect against data failure for the respective horizontal data stripe. According to the vertical XOR parity scheme, the XOR parity group spans vertically across a single plane, for example, such that the last block of a plane or set of blocks of the plane is programmed with XOR parity data. The XOR parity data may protect against data failure for the respective vertical data stripe.

Unlike the superblock 300 of FIG. 3, the superblock 600, specifically die 7, has about 50% reduced XOR parity data when compared to the superblock 300. The XOR parity data 602 may be located on a single plane of a single die, such as PL1 of die 7. Like the superblock 600, the superblock 650 has about 50% reduced XOR parity data when compared to the superblock 300. However, rather than having XOR parity data on a single plane of a single die, the XOR parity data 602 may be stored on alternating strings, such as on STR1 and STR3 of WL0, where the XOR parity data 602 is stored on both PL0 and PL1 of a single die, such as the die 7. Likewise, the 1:15 parity group 652 illustrates where the parity (P) may be located on alternating wordlines.

The reduced XOR parity data may be due the additional read verify/EPWR operations to check for PSF and silent program failures. The about 50% XOR parity data of the superblock 600, 650 may only recover a block or a plane of a die 604 rather than a whole die failure. The parity group ratio may be about 1:15 rather than 1:7 as previously illustrated in FIG. 3. However, because the additional read verify/EPWR operations are executed on the programmed wordlines and/or erase blocks of the superblock, the UBER may be substantially less than the programmed wordlines and/or erase blocks of the superblock that does not have additional read verify/EPWR operations executed on the wordlines and/or erase blocks of the superblock.

Figure 7:
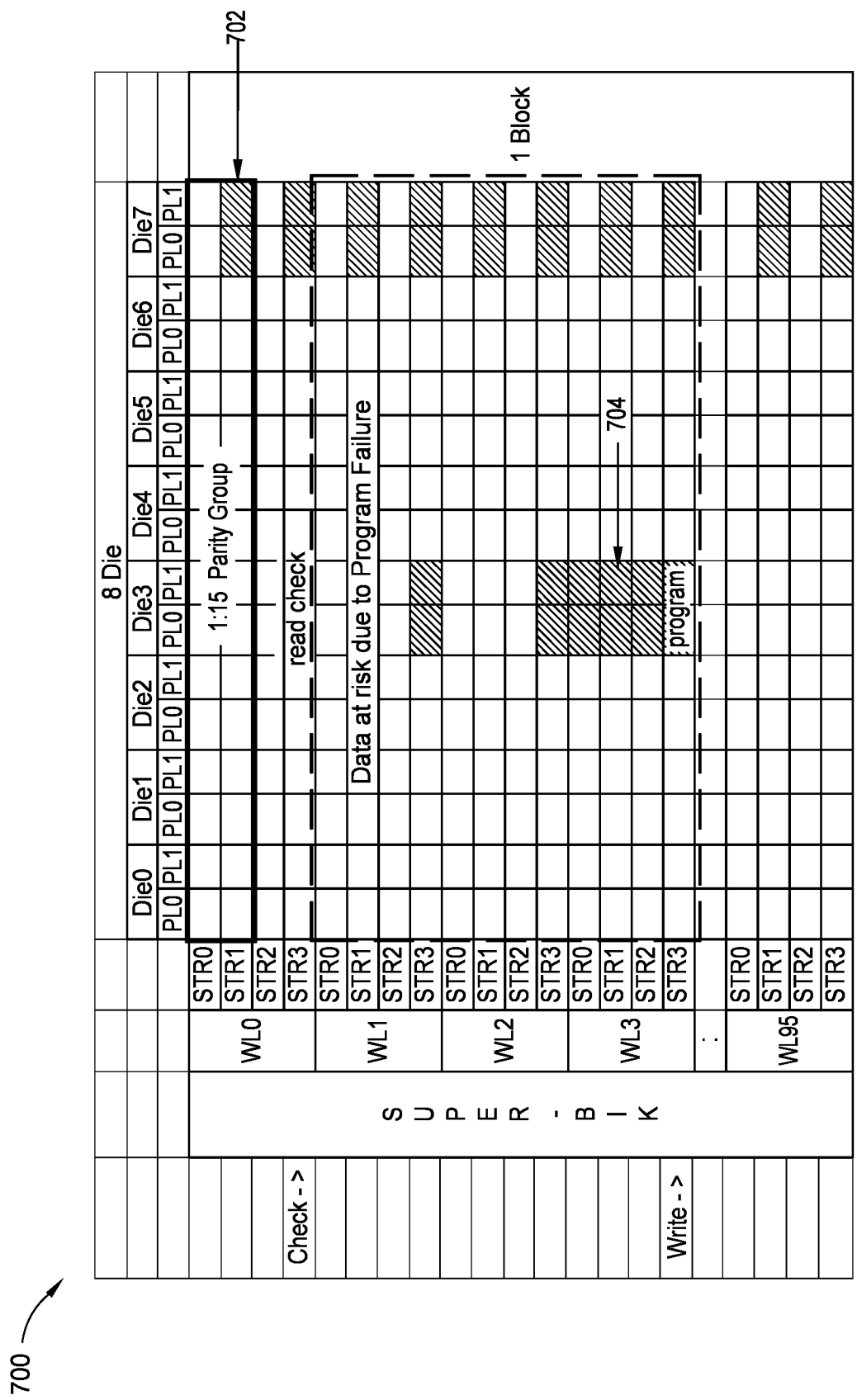
FIG. 7 is a schematic illustration of a reduced horizontal exclusive or (XOR) scheme of a superblock, according to disclosed embodiments.

FIG. 7 is a schematic illustration of a reduced horizontal exclusive or (XOR) scheme of a superblock 700, according to disclosed embodiments. Aspects of the superblock 650 of FIG. 6B may be similar to the superblock 700. Although a superblock scheme is exemplified, it is contemplated that the disclosed embodiments may be applicable to non-superblock schemes.

Furthermore, it is to be understood that while a vertical XOR scheme is exemplified, the embodiments may be applicable to a reduced horizontal XOR scheme. For example, the superblock 700 has a 1:15 parity group ratio, where the XOR parity data 702 is stored on alternating strings. Regarding the superblock 700, the fourth string, STR3, of the fourth wordline, WL3 is being programmed to. The data at risk due to program failure are the two previously programmed wordlines WL2 and WL1. However, the source blocks for the data of WL2 and WL1 are stored in the SLC memory, such as the SLC memory 222 of FIG. 2. WL0 may be considered "safe", where a successful read verify/EPWR operation, such as the read verify/EPWR operation described in FIG. 4, has been completed on the data of WL0. The program failures 704, both PSF and silent program failures, may still exist in WL1, WL2, and WL3 because the read verify/EPWR operation has not yet been executed.

Figure 8:
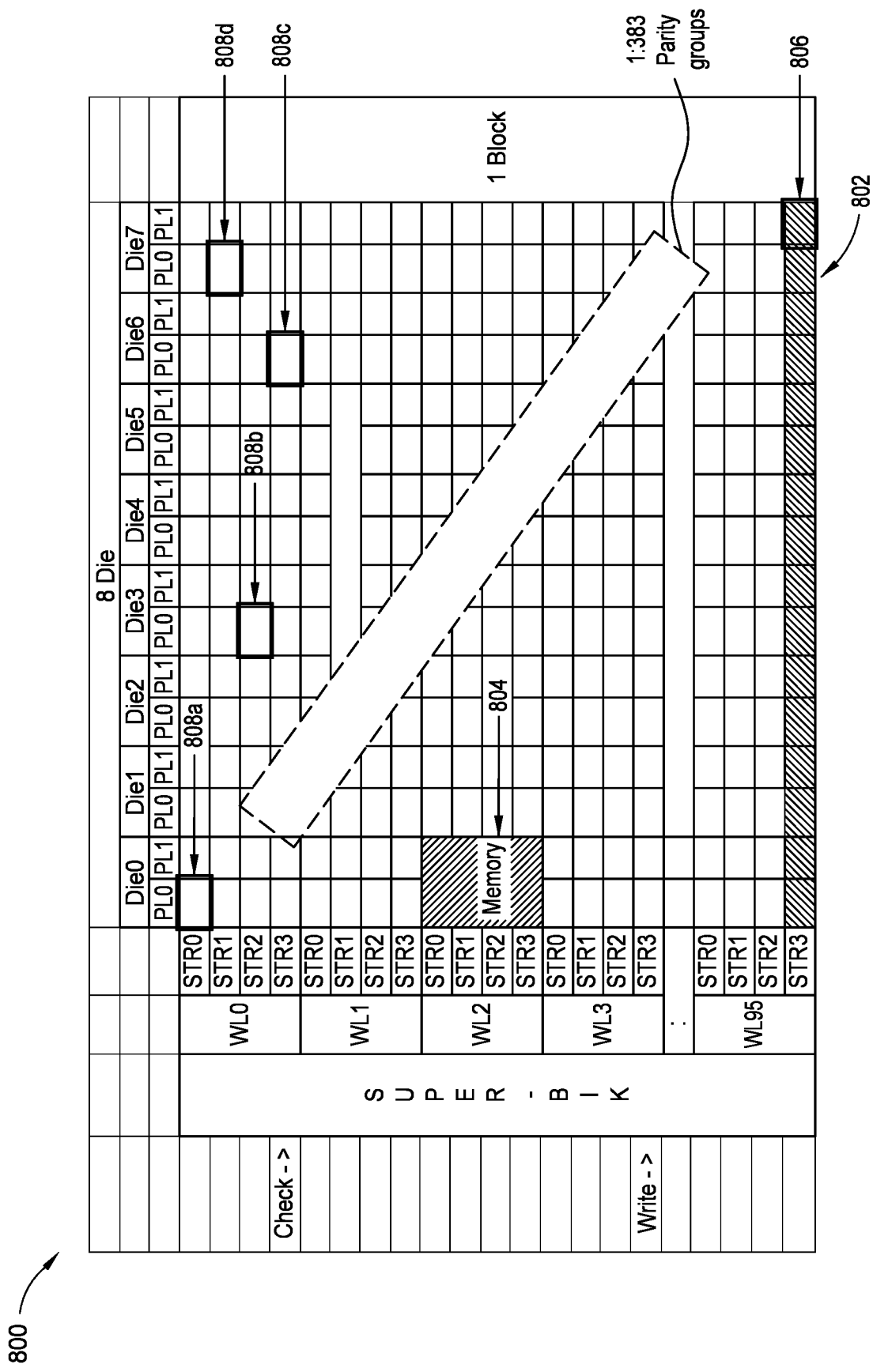
FIG. 8 is a schematic illustration of a reduced vertical exclusive or (XOR) scheme of a superblock, according to disclosed embodiments.

FIG. 8 is a schematic illustration of a reduced vertical exclusive or (XOR) scheme of a superblock 800, according to disclosed embodiments. Although a superblock scheme is exemplified, it is contemplated that the disclosed embodiments may be applicable to non-superblock schemes. Furthermore, it is to be understood that while a vertical XOR scheme is exemplified, the embodiments may be applicable to a reduced horizontal XOR scheme. The superblock 800 exemplifies the 1:383 parity groups scheme as illustrated in FIG. 4, where the 1:383 refers to 1 XOR parity data for 383 other cells in a QLC memory that includes 96 wordlines and 8 dies. In some examples, the number of parity groups per superblock may be reduced to half or a quarter of the superblock, such that the superblock includes between about 2 and about 4 parity groups. For example, each of the parity groups may protect against data failures of the respective die and a neighboring adjacent die.

Rather than programming XOR parity data to the last die of each wordline, the XOR parity data 802 is programmed to the last string of the last wordline, such that the XOR parity data protects the previous wordlines and the previous strings for each plane and/or die. In some examples, the XOR parity data 802 may be stored in volatile memory, such as the volatile memory 112 of FIG. 1, until the completion of the program to the previous strings and wordlines as to maintain a sequential program to the superblock.

In one example, the XOR parity data may protect along the same die and/or plane, such that a first XOR parity data 806 in Die7, PL1, WL 95, STR3 may protect a fourth location 808d in Die7, PL0, WL0, STR1. In another example, the first XOR parity data 806 in Die7, PL1, WL 95, STR3 may protect a scattered group of cells such as the first location 808a, second location 808b, third location 808c, and fourth location 808d. Furthermore, volatile memory and/or the NVM, such as the SLC memory 222 of FIG. 2, may store the last erase block of data such that a first erase block 804 may be recovered.

Figure 9:
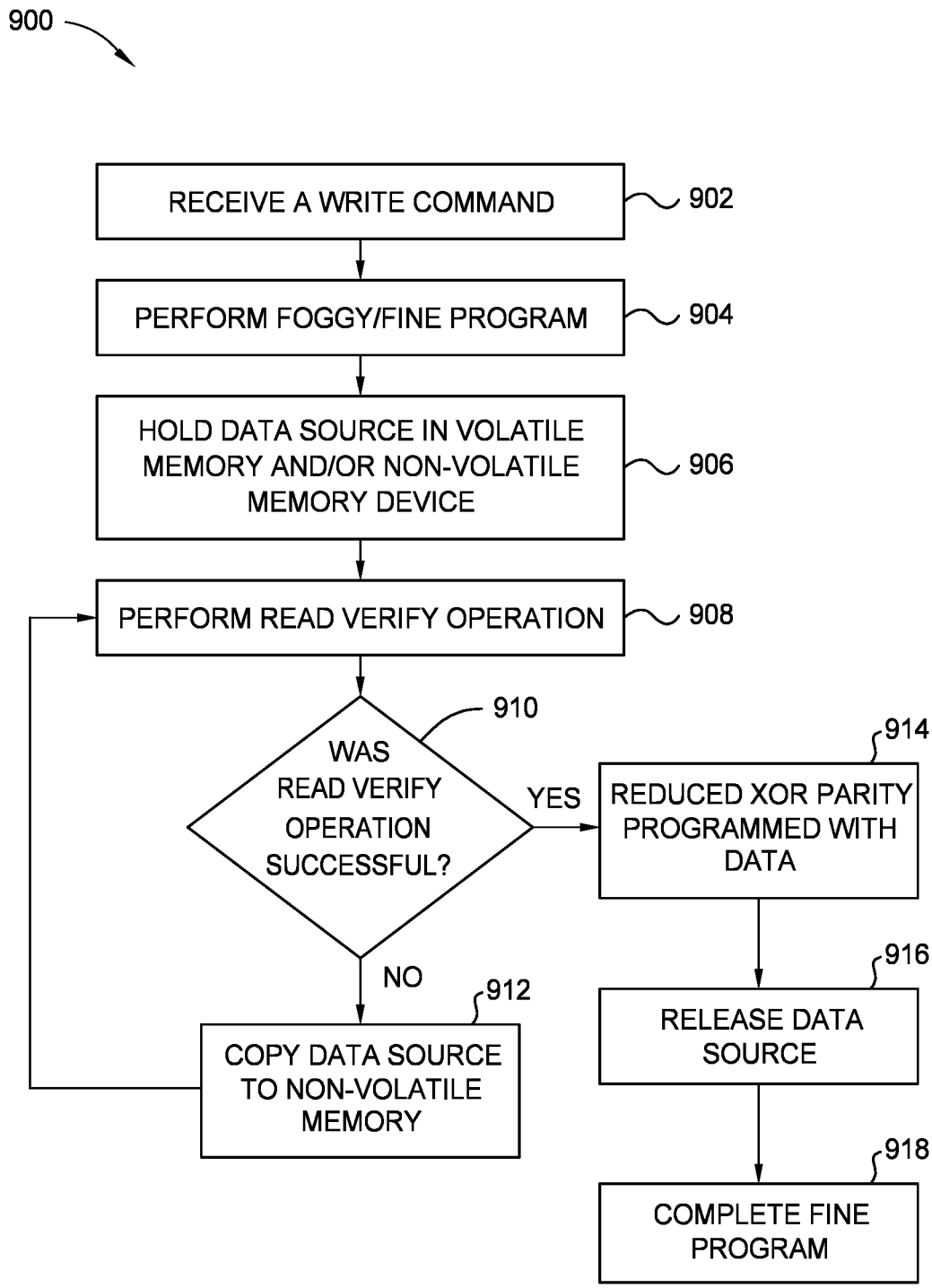
FIG. 9 is a flowchart illustrating a method of performing a foggy-fine program, according to disclosed embodiments.

FIG. 9 is a flowchart illustrating a method 900 of performing a foggy-fine program, according to disclosed embodiments. At block 902, the controller, such as the controller 108 of FIG. 1, receives a write command. The controller performs a foggy/fine program at block 904 to the non-volatile memory, such as the MLC memory 224 of FIG. 2. The data associated with the fine program may be written to one or more wordlines, such as a first wordline and a second wordline, of the NVM or to an erase block of the NVM.

At block 906, the data source (i.e., the data associated with the write command at block 902) is held in a volatile memory, such as the volatile memory 112 of FIG. 1, and/or in a NVM, such as the SLC memory 222 of FIG. 2, where the data source may store up to about two wordlines last fine program written to the NVM or the last erase block fine programmed to the NVM. At block 908, a read verify operation occurs on the data that is fine programmed to the NVM. The read verify operation may be an enhanced post write read operation. Furthermore, the read verify operation may occur to either the last two wordlines previously programmed, such as a first wordline and a second wordline, the last erase block previously written, or each wordline of the last erase block previously written. The read verify operation checks for program failures such as PSF, silent program failures, and the like.

At block 910, the controller determines if the read verify operation was successful. If the read verify operation was not successful (i.e., a program failure is present) at block 910, then at block 912, the data source stored in the SLC memory is copied to the MLC memory, where copying the data to the MLC memory is a fine program. The controller then performs a read verify operation on the copied data at block 908. However, if the read verify operation is successful at block 910, then a reduced amount of XOR parity data programed with data at block 914, such that the XOR parity data programmed may be about 50% of the XOR parity data programmed in previous approaches. The amount of XOR parity data programmed may depend on the level of programming redundancy performed, such as the different redundancy levels described previously in FIG. 4.

For example, when programming the data to the MLC memory, a plane of a die across each of the plurality of wordlines may include an XOR parity element (i.e., XOR parity data). The plurality of wordlines include a plurality of strings, where the XOR parity element is written to alternating strings of a die and at least one string of the plurality of strings does not include XOR parity data. Rather than programming a whole die with XOR parity data, about half a die is programmed with XOR parity data after a successful read verify operation. It is to be understood that the reduced XOR parity data scheme may be a reduced horizontal parity scheme, a vertical reduced parity scheme, or a combination of the previously mentioned schemes. Furthermore, in some examples the vertical reduced parity scheme may be a scattered vertical parity scheme, such that the XOR parity data does protects different cells or bits per plane of each die. In some embodiments, the SLC memory and the QLC memory may not have the same XOR parity scheme. For example, the SLC memory has a first ratio, where the first ratio is about a 1:7 parity group ratio, and the MLC memory has a second ratio, where the second ratio is about a 1:15 parity group ratio. Furthermore, in some examples, the MLC memory may have not have any XOR parity data, such as the fourth FW read verify/EPWR check embodiment 406 described in FIG. 4.

At block 916, the data source associated with the data of the successful read verify operation is released from the SLC memory, the buffer, and/or the cache. At block 918, the fine program is completed.

By performing a read verify operation to different levels of the non-volatile memory, such as on a wordline to wordline basis, on an erase block basis, or on each wordline of an erase block basis, and storing the data source in the SLC memory, the buffer, and/or the cache, the size of the XOR parity data of the fine program to the NVM may be decreased and the reliability of the data may be increased.

In one embodiment, a data storage device includes one or more memory devices that includes one or more superblocks, where each superblock of the one or more superblocks includes a plurality of wordlines, and a controller coupled to the one or more memory devices. The controller is configured to write data to a first wordline of the plurality of wordlines, write data to a second wordline of the plurality of wordlines, perform a read verify operation on the first wordline, and perform a read verify operation on the second wordline, where at least one of the first wordline and the second wordline does not include an XOR parity element.

Each wordline of the plurality of wordlines comprises a plurality of strings. At least one string of the plurality of strings does not include exclusive or (XOR) data. At least one of the one or more memory devices is a multi-level cell (MLC) memory and another one of the one or more memory devices is a single-level cell (SLC) memory. The data is first written to the SLC memory and the data is second written to the MLC memory. The one or more memory devices includes a plurality of dies. Each of the plurality of dies includes a first plane and a second plane. At least one plane of the plurality of planes includes exclusive or (XOR) data. Up to about two wordlines of the SLC memory includes data written to the MLC memory. The read verify operation is enhanced post write read (EPWR)

In another embodiment, a data storage device includes one or more memory devices that includes one or more superblocks, where each superblock of the one or more superblocks includes a plurality of erase blocks, and where each erase block of the plurality of erase blocks includes a plurality of wordlines. The data storage device further includes a controller coupled to the one or more memory devices. The controller is configured to write data to the plurality of wordlines of a first erase block of the plurality of erase blocks of at least one memory device of the one or more memory devices, where less than all of the plurality of wordlines includes an XOR element, and perform a read verify operation to less than all of the plurality of wordlines of the first erase block after the first entire erase block has been programmed.

At least one of the one or more memory devices is a multi-level cell (MLC) memory and another one of the one or more memory devices is a single-level cell (SLC) memory. The data written to the SLC memory is released after a successful read verify operation is performed to the entire erase block of the MLC memory. The data written to the SLC memory is re-written to a second erase block of the MLC memory when the read verify operation is unsuccessful. The one or more memory devices includes one or more dies, each including a first plane and a second plane, where each plane includes one or more erase blocks. The controller is further configured to perform a read verify operation to at least one of all of the plurality of wordlines and all of the plurality of erase blocks, where the read verify operation is enhanced post write read. The performing a read verify operation includes checking at least one of each wordline of the plurality of wordlines and each erase block of the plurality of erase blocks for program failures. The XOR element is at least one of a full die redundancy, a full plane redundancy, and an erase block redundancy.

In another embodiment, a data storage device includes a first memory device having a first XOR storage capacity for a first XOR element, where the first XOR storage capacity relative to data stored in the first memory device is a first ratio. The data storage device further includes a second memory device having a second XOR storage capacity for a second XOR element, where the second XOR storage capacity relative to data stored in the second memory device is a second ratio, and where the second ratio is different from the first ratio. The data storage device further includes a volatile memory and a controller means coupled to the first memory device and the second memory device.

The volatile memory is random access memory (RAM). The first memory device is a single-level cell (SLC) memory and the second memory device is a multi-level cell (MLC) memory. The first memory device and the second memory device each includes a plurality of dies that includes a first plane and a second plane, where the first plane and the second plane each includes a plurality of erase blocks, and a plurality of superblocks that includes a plurality of wordlines, where each wordline of the plurality of wordlines includes a plurality of strings. The controller means includes means to perform a read verify operation to detect program failures, where the read verify operation is an enhanced post write read, means to hold a data source in at least one of the first memory device and the volatile memory, and means to generate a first XOR element and a second XOR element, where the second XOR element is different from the first XOR element. The second ratio is substantially smaller than the first ratio. The means to perform a read verify operation includes either checking each wordline of the plurality of wordlines for program failures, each erase block of the plurality of erase blocks for program failures, or both each wordline of the plurality of wordlines and each erase block of the plurality of erase blocks for program failures. The data source includes up to two wordlines, when checking each wordline of the plurality of wordlines for program failures, of data written to the second memory device, and an erase block, when checking either each erase block of the plurality of erase blocks for program failures or both each wordline of the plurality of wordlines and each erase block of the plurality of erase blocks for program. The controller means is configured to perform an enhanced post write read (EPWR) for each wordline of the first memory device and the second memory device. The controller means is configured to perform an enhanced post write read (EPWR) for less than all wordlines of the first memory device. At least one of the first memory device and the second memory device comprises a first wordline and a second wordline adjacent the first wordline, wherein the controller means is configured to perform an enhanced post write read (EPWR) for the second wordline and not perform an EPWR to the first wordline. The first memory device has a different XOR scheme as compared to the second memory device.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   one or more memory devices comprising one or more superblocks, wherein each superblock of the one or more superblocks comprises a plurality of wordlines; and
   a controller coupled to the one or more memory devices, wherein the controller is configured to:
   write data to a first wordline of the plurality of wordlines;
   write data to a second wordline of the plurality of wordlines;
   perform a read verify operation on the first wordline; and
   perform a read verify operation on the second wordline, wherein at least one of the first wordline and the second wordline does not include an XOR parity element, and wherein one or more wordlines of the plurality of wordlines includes the XOR parity element.

2. The data storage device of claim 1, wherein each wordline of the plurality of wordlines comprises a plurality of strings.

3. The data storage device of claim 2, wherein at least one string of the plurality of strings of the one or more wordlines of the plurality of wordlines that includes the XOR parity element does not include exclusive or (XOR) data.

4. A data storage device, comprising:
   one or more memory devices comprising one or more superblocks, wherein each superblock of the one or more superblocks comprises a plurality of wordlines of claim 1, and wherein at least one of the one or more memory devices is a multi-level cell (MLC) memory and another one of the one or more memory devices is a single-level cell (SLC) memory, and wherein the data is first written to the SLC memory and the data is second written to the MLC memory; and
   a controller coupled to the one or more memory devices, wherein the controller is configured to:
   write data to a first wordline of the plurality of wordlines;
   write data to a second wordline of the plurality of wordlines;
   perform a read verify operation on the first wordline; and perform a read verify operation on the second wordline, wherein at least one of the first wordline and the second wordline does not include an XOR parity element.

5. The data storage device of claim 4, wherein the one or more memory devices comprises a plurality of dies, and wherein each of the plurality of dies comprises a first plane and a second plane.

6. The data storage device of claim 5, wherein at least one plane of the first plane and the second plane includes exclusive or (XOR) data.

7. The data storage device of claim 4, wherein up to about two wordlines of the SLC memory comprises data written to the MLC memory.

8. A data storage device, comprising:
one or more memory devices comprising one or more superblocks, wherein each superblock of the one or more superblocks comprises a plurality of wordlines; and
a controller coupled to the one or more memory devices, wherein the controller is configured to:
write data to a first wordline of the plurality of wordlines;
write data to a second wordline of the plurality of wordlines;
perform a read verify operation on the first wordline; and
perform a read verify operation on the second wordline, wherein at least one of the first wordline and the second wordline does not include an XOR parity element, and wherein the read verify operation is enhanced post write read (EPWR).

9. A data storage device, comprising:
one or more memory devices comprising one or more superblocks, wherein each superblock of the one or more superblocks comprises a plurality of erase blocks, and wherein each erase block of the plurality of erase blocks comprises a plurality of wordlines; and
a controller coupled to the one or more memory devices, wherein the controller is configured to:
write data to the plurality of wordlines of a first erase block of the plurality of erase blocks of at least one memory device of the one or more memory devices, wherein less than all of the plurality of wordlines includes an XOR element; and
perform a read verify operation to less than all of the plurality of wordlines of the first erase block after the first entire erase block has been programmed.

10. The data storage device of claim 9, wherein at least one of the one or more memory devices is a multi-level cell (MLC) memory and another one of the one or more memory devices is a single-level cell (SLC) memory, and wherein the data written to the SLC memory is released after a successful read verify operation is performed to the entire erase block of the MLC memory.

11. The data storage device of claim 10, wherein the data written to the SLC memory is re-written to a second erase block of the MLC memory when the read verify operation is unsuccessful.

12. The data storage device of claim 10, wherein the one or more memory devices comprises one or more dies, each comprising a first plane and a second plane, wherein each plane comprises one or more erase blocks.

13. The data storage device of claim 12, wherein the controller is further configured to:
perform a read verify operation to at least one of all of the plurality of wordlines and all of the plurality of erase blocks, wherein the read verify operation is enhanced post write read, and wherein performing a read verify operation comprises:
checking at least one of each wordline of the plurality of wordlines and each erase block of the plurality of erase blocks for program failures.

14. The data storage device of claim 9, wherein the XOR element is at least one of a full die redundancy, a full plane redundancy, and an erase block redundancy.

15. A data storage device, comprising:
a first memory device having a first XOR storage capacity for a first XOR element, wherein the first XOR storage capacity relative to data stored in the first memory device is a first ratio;
a second memory device having a second XOR storage capacity for a second XOR element, wherein the second XOR storage capacity relative to data stored in the second memory device is a second ratio, and wherein the second ratio is different from the first ratio;
a volatile memory; and
a controller means coupled to the first memory device and the second memory device.

16. The data storage device of claim 15, wherein the volatile memory is random access memory (RAM), wherein the first memory device is a single-level cell (SLC) memory and the second memory device is a multi-level cell (MLC) memory, and wherein the first memory device and the second memory device each comprises:
a plurality of dies comprising a first plane and a second plane, wherein the first plane and the second plane each comprises a plurality of erase blocks; and
a plurality of superblocks comprising a plurality of wordlines, wherein each wordline of the plurality of wordlines comprises a plurality of strings.

17. The data storage device of claim 16, wherein the controller means comprises:
means to perform a read verify operation to detect program failures, wherein the read verify operation is an enhanced post write read;
means to hold a data source in at least one of the first memory device and the volatile memory; and
means to generate a first XOR element and a second XOR element, wherein the second XOR element is different from the first XOR element.

18. The data storage device of claim 17, wherein the means to perform a read verify operation comprises either checking each wordline of the plurality of wordlines for program failures, each erase block of the plurality of erase blocks for program failures, or both each wordline of the plurality of wordlines and each erase block of the plurality of erase blocks for program failures.

19. The data storage device of claim 18, wherein the data source comprises:
up to two wordlines, when checking each wordline of the plurality of wordlines for program failures, of data written to the second memory device; and
an erase block, when checking either each erase block of the plurality of erase blocks for program failures or both each wordline of the plurality of wordlines and each erase block of the plurality of erase blocks for program failures, of data written to the second memory device.

20. The data storage device of claim 15, wherein the second ratio is substantially smaller than the first ratio.

21. The data storage device of claim 15, wherein the controller means is configured to perform an enhanced post write read (EPWR) for each wordline of the first memory device and the second memory device.

22. The data storage device of claim 15, wherein the controller means is configured to perform an enhanced post write read (EPWR) for less than all wordlines of the first memory device.

23. The data storage device of claim 15, wherein at least one of the first memory device and the second memory device comprises a first wordline and a second wordline adjacent the first wordline, wherein the controller means is configured to perform an enhanced post write read (EPWR) for the second wordline and not perform an EPWR to the first wordline.

24. The data storage device of claim 15, wherein the first memory device has a different XOR scheme as compared to the second memory device.

* * * * *